(12) United States Patent
Kaza et al.

(10) Patent No.: US 7,269,050 B2
(45) Date of Patent: Sep. 11, 2007

(54) METHOD OF PROGRAMMING A MEMORY DEVICE

(75) Inventors: Swaroop Kaza, Woburn, MA (US); David Gaun, Brookline, MA (US); Stuart Spitzer, Lynnfield, MA (US); Juri Krieger, Brookline, MA (US)

(73) Assignee: Spansion LLC, Sunnyvale, CA (US)

( * ) Notice: Subject to any disclaimer, the term of this patent is extended or adjusted under 35 U.S.C. 154(b) by 73 days.

(21) Appl. No.: 11/146,690

(22) Filed: Jun. 7, 2005

(65) Prior Publication Data

US 2006/0274567 A1 Dec. 7, 2006

(51) Int. Cl.
*G11C 11/22* (2006.01)

(52) U.S. Cl. .................. 365/145; 365/185.03

(58) Field of Classification Search .......... 365/148, 365/185.03, 145
See application file for complete search history.

(56) References Cited

U.S. PATENT DOCUMENTS

| | | | |
|---|---|---|---|
| 5,289,410 A * | 2/1994 | Katti et al. | 365/170 |
| 5,912,839 A * | 6/1999 | Ovshinsky et al. | 365/185.03 |
| 6,795,355 B2 * | 9/2004 | Ooishi | 365/201 |
| 6,809,336 B2 * | 10/2004 | Kunikiyo et al. | 257/66 |
| 6,838,720 B2 * | 1/2005 | Krieger et al. | 257/296 |
| 6,847,544 B1 * | 1/2005 | Smith et al. | 365/158 |
| 2002/0051384 A1 * | 5/2002 | Cernea et al. | 365/185.21 |
| 2004/0001351 A1 * | 1/2004 | Subramanian et al. | 365/158 |
| 2004/0004856 A1 * | 1/2004 | Sakimura et al. | 365/158 |
| 2004/0026714 A1 * | 2/2004 | Krieger et al. | 257/200 |
| 2004/0245522 A1 | 12/2004 | VanBuskirk et al. | 257/40 |
| 2005/0007830 A1 * | 1/2005 | Perner et al. | 365/189.07 |
| 2005/0092983 A1 | 5/2005 | Lyons et al. | 257/40 |
| 2006/0002172 A1 * | 1/2006 | Venkataraman et al. | 365/148 |

* cited by examiner

*Primary Examiner*—Michael T Tran

(57) ABSTRACT

The present invention is a method of programming a memory device, wherein different levels or magnitudes of current may be applied to and imposed on the memory device so that any one of a plurality of memory states may be realized. A read step indicates the so determined state of the memory device.

17 Claims, 6 Drawing Sheets

METHOD OF PROGRAMMING A MEMORY DEVICE

BACKGROUND OF THE INVENTION

1. Technical Field

This invention relates generally to memory devices, and more particularly, to a memory device which is programmable to any of a plurality of states.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state (e.g. are limited to 2 states), also referred to as "0" and "1". Typically, a memory device is addressed to retrieve a specified number of byte(s) (e.g., 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30 which includes advantageous characteristics for meeting these needs. The memory device 30 includes, for example, a Cu electrode 32, a superionic layer 34 such as $Cu_2S$ on the electrode 32, an active layer 36 such as $Cu_2O$ and/or various polymers on the $Cu_2S$ layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the "programming" electrical potential) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to rapidly switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. This potential $V_{er}$ is sufficient to cause copper ions to be repelled from the active layer 36 toward the electrode 32 and into the superionic layer 34, in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

As will be seen, the memory device as thus far shown and described is capable of adopting two states, i.e., a first, conductive state, or "on" state, and a second, substantially non-conductive, or "off" state. Each memory device thus can include information as to the state of a single bit, i.e., either 0 or 1. However, it would be highly desirable to be able to provide a memory device which is capable of adopting any of a plurality of states, so that, for example, in the case where four different states of the memory device can be adopted, two bits of information can be provided as chosen (for example first state equals 00, second state equals 01, third state equals 10, fourth state equals 11).

Therefore, what is needed is an approach wherein a memory device may adopt each of a plurality of states, each relating to the information held thereby.

DISCLOSURE OF THE INVENTION

Broadly stated, the present invention is a method of programming a memory device which is capable of having any of a plurality of states, the method comprising applying a selected level of current to the memory device to provide that the memory device has one of the plurality of states.

Broadly stated, another aspect of the invention is a method of programming memory devices of a memory array comprising a first plurality of conductors, a second plurality of conductors, and a plurality of connecting structures, each connecting a conductor of the first plurality thereof with a conductor of the second plurality thereof, each connecting structure comprising a memory device, each memory device being capable of having any of a plurality of states, the method comprising applying a first selected level of current to a first memory device of the array to provide that the first memory device has a first of the plurality of states, and applying a second selected level of current to a second memory device of the array to provide that the second memory device has a second of the plurality of states.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
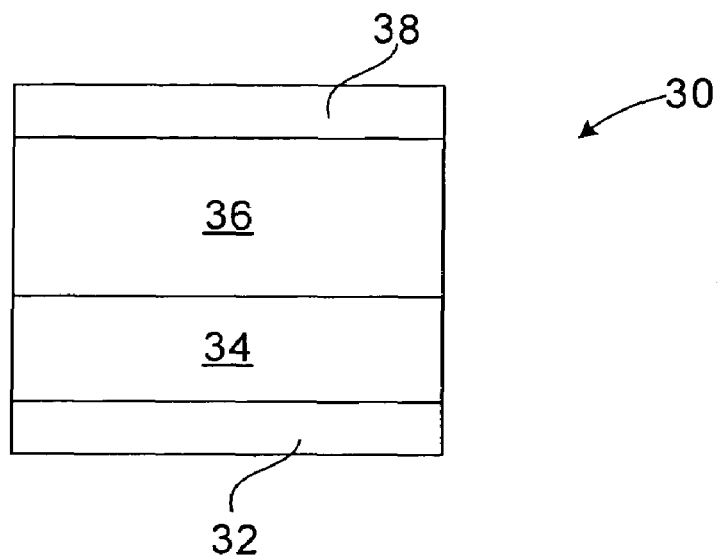
FIG. 1 is a cross-sectional view of a typical memory device.
Figure 2:
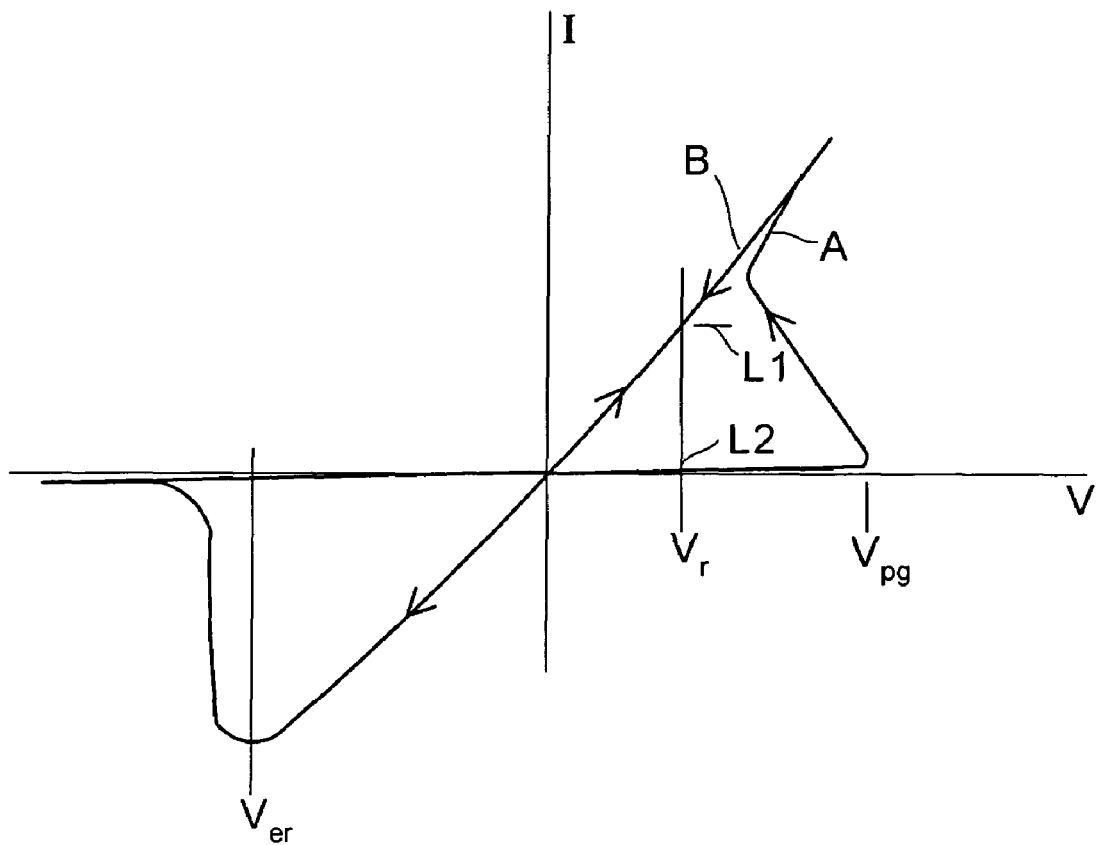
FIG. 2 is a plot of current vs. voltage in the programming, reading and erasing of the memory device of FIG. 1.
Figure 3:
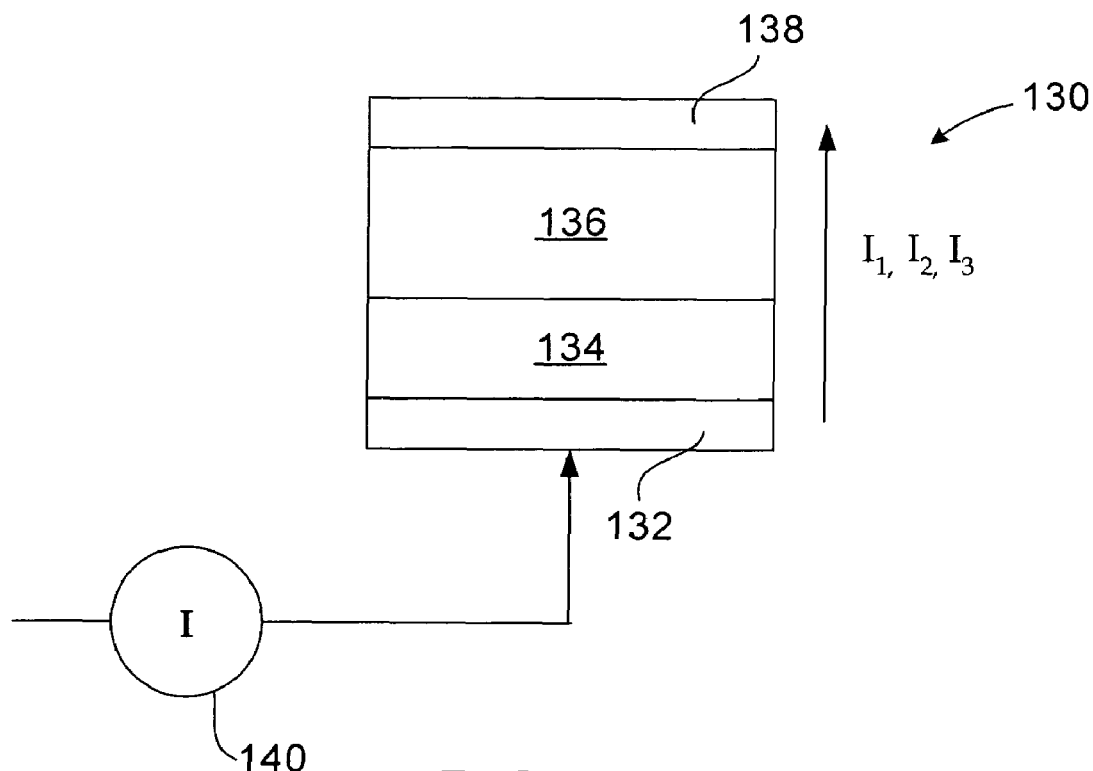
FIG. 3 is a view similar to 1, illustrating the present approach to programming the memory device.

FIG. 3 illustrate a memory device 130 similar to the memory device 30. The memory device 130 includes, for example, a Cu electrode 132, a superionic layer 134 such as $Cu_2S$ on the electrode 132, an active layer 136 such as $Cu_2O$ and/or various polymers on the $Cu_2S$ layer 134, and a Ti electrode 138 on the active layer 136. Operatively connected to the memory device 130 is a current source 140 which is capable of imposing on and applying to the memory device 130 various selected levels of particular current in the same direction, as will be shown and described, i.e., for example, current level $I_1$, current level $I_2$ (different from current level $I_1$), and current level $I_3$ (different from current levels $I_1$ and $I_2$), with in this particular example $I_3 > I_2 > I_1$. The current source 140 may take any well-known form which is capable of providing this function.

Figure 4:
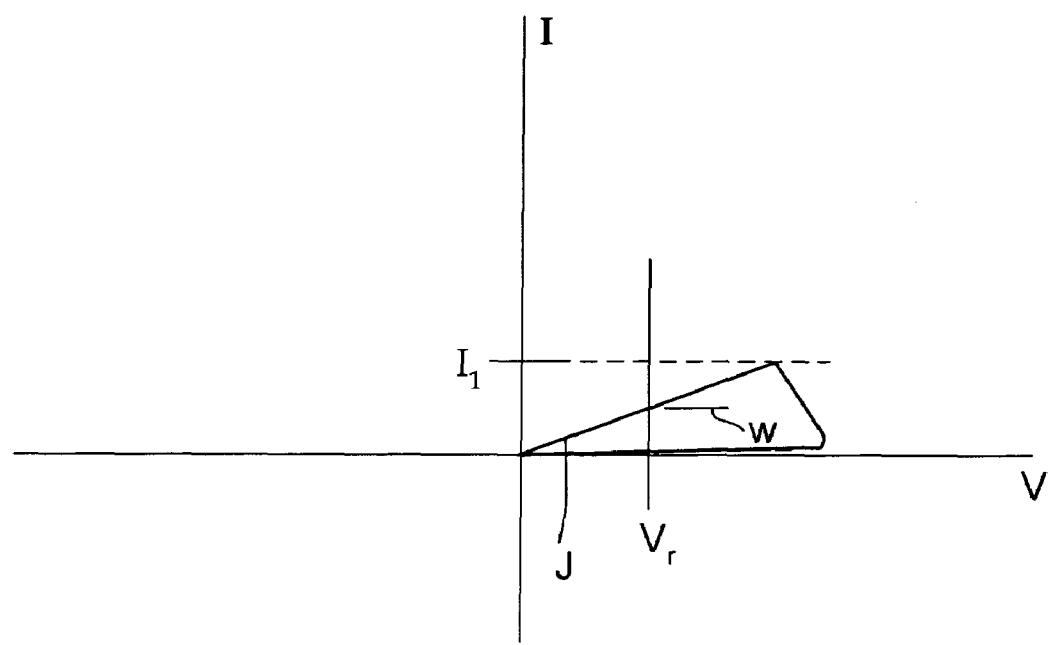
FIG. 4 is a plot of current vs. voltage illustrating the programming of the memory device to a first state, along with the reading of that state.

FIG. 4 illustrates the programming of the memory device 130 from its erased state to a first state. In this programming step, the current level $I_1$ is applied to and imposed on the memory device 130 by current source 140 in the direction from electrode 132 to electrode 138. This current $I_1$ causes the active layer 136 (and the overall memory device 130) to rapidly switch to a low-resistance or conductive state, the resistance characteristic of which is illustrated at J, this resistance characteristic being determined by the level of current $I_1$ applied to the memory device 130. Upon removal of such current the active layer 136 (and memory device 130) remain in a conductive or low-resistance state, as indicated by the resistance characteristic J.

FIG. 4 also illustrates the read step of the memory device 130 programmed in accordance with this FIG. 4. Application of a read voltage $V_r$ from higher to lower potential in the forward direction of the memory device 130 (insufficient to affect the programming of the memory device 130) causes a current level W to flow through the memory device 130.

Figure 5:
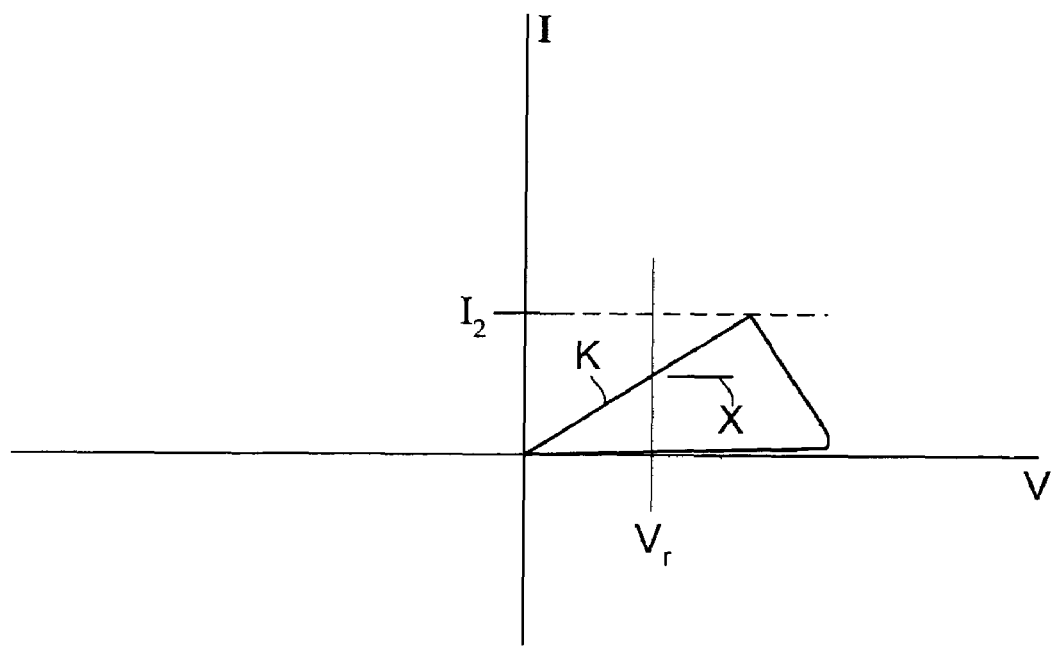
FIG. 5 is a plot of current vs. voltage illustrating the programming of the memory device to a second state, along with the reading of that state.

FIG. 5 illustrates the programming of the memory device 130 from its erased state to a second state. In this programming step, the current level $I_2$ is applied to and imposed on the memory device 130 by current source 140 in the direction from electrode 132 to electrode 138. This current $I_2$ causes the active layer 136 (and the overall memory device 130) to rapidly switch to a low-resistance or conductive state (lower-resistance than in the first state), the resistance characteristic being illustrated at K, this resistance characteristic being determined by the level of current $I_2$ applied to the memory device 130. Upon removal of such current, the active layer 136 (and memory device 130) remain in a conductive or low-resistance state, as indicated by the resistance characteristic K.

FIG. 5 also illustrates the read step of the memory device 130 programmed in accordance with this FIG. 5. Application of the same read voltage $V_r$ from higher to lower potential in the forward direction of the memory device 130, i.e., from electrode 132 to electrode 138, (again insufficient to affect the programming of the memory device 130) causes a current level X to flow through the memory device 130.

Figure 6:
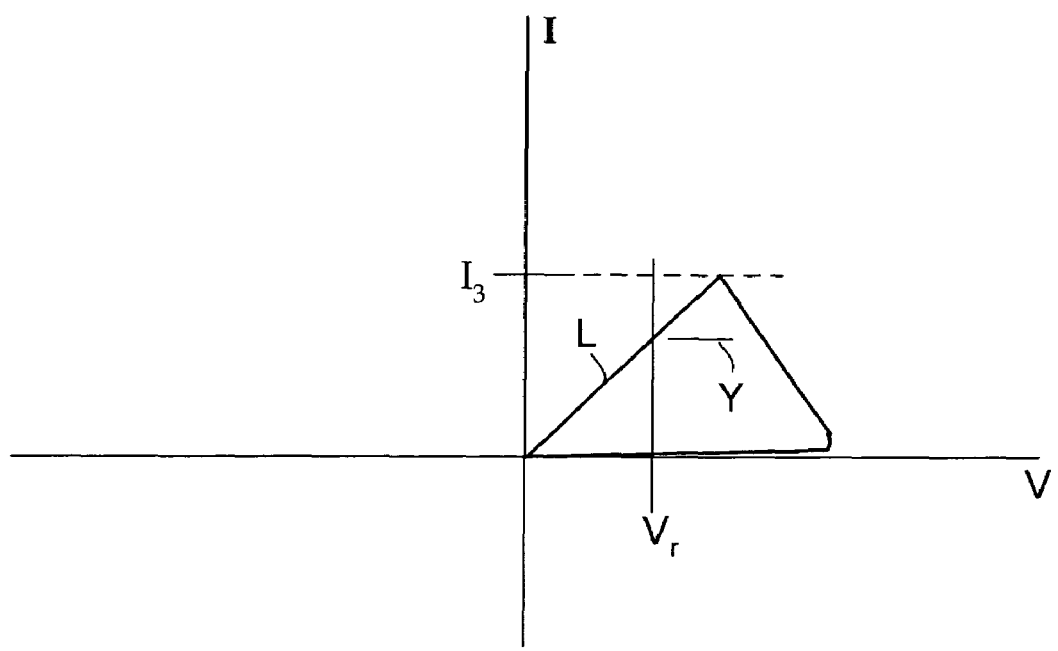
FIG. 6 is a plot of current vs. voltage illustrating the programming of the memory device to a third state, along with the reading of that state.

FIG. 6 illustrates the programming of the memory device 130 from its erased state to a third state. In this programming step, the current level $I_3$ is applied to and imposed on the memory device 130 by the current source 140 in the direction from electrode 132 to electrode 138. This current $I_3$ causes the active layer 136 (and the overall memory device 130) to rapidly switch to a low-resistance or conductive state (lower-resistance than in the first state or the second state), the resistance characteristic being illustrated at L, this resistance characteristic being determined by the level of current $I_3$ applied to the memory device 130. Upon removal of current the active layer 136 (and memory device 130) remain in a conductive or low-resistance state, as indicated by the resistance characteristic L.

FIG. 6 also illustrates the read step of the memory device 130 programmed in accordance with this FIG. 6. Application of the same read voltage $V_r$ from higher to lower potential in the forward direction of the memory device 130, i.e., from electrode 132 to electrode 138 (again insufficient to affect the programming of the memory device 130) causes a current level Y to flow through the memory device 130.

Figure 7:
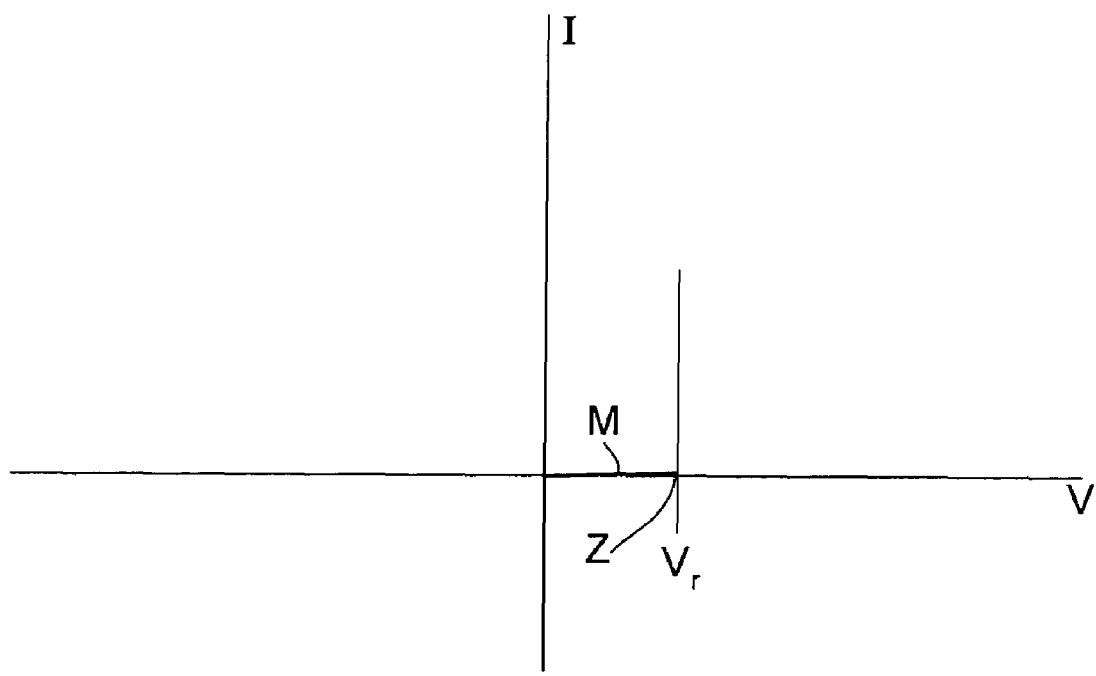
FIG. 7 is a plot of current vs. voltage illustrating the present memory device in its erased state, along with the reading of that state.

FIG. 7 illustrates the read step for the memory device 130 in its erased state. As shown therein, the same electrical potential $V_r$ is applied to the memory device 130 from higher to lower potential in the forward direction of the memory device 130, i.e., from electrode 132 to electrode 138. Again, this electrical potential $V_r$ is low enough so as to be insufficient to cause the memory device 130 to adopt a programmed state. The memory device 130 in its unprogrammed state provides a very high resistance, the resistance characteristic of the memory device 130 being illustrated at M, so that substantially no current (Z) flows through the memory device 130.

The level of current applied to the memory device 130 by the current source 140 determines the resistance characteristic of the memory device 130, in particular, determining the slope of the resistance characteristic. As will be seen, the higher the current level applied to the memory device 130, the greater the slope of the resistance characteristic, and the lower resistance of the memory device 130.

In the present example, the memory device 130 may adopt any of a plurality of states, in this case, any one of four distinct states, corresponding to four different and distinct resistance characteristics. The state of the memory device 130 can be read by applying a specific, particularly chosen read voltage $V_r$ as described above. With the memory device 130 in its first state (FIG. 4), application of read voltage $V_r$ causes current at level W-to flow through the memory device current level W being determined by the resistance characteristic J of the memory device 130, which current level W is indicative of the memory device 130 being in its first state. The current level W can readily be observed.

With the memory device 130 in its second state (FIG. 5), application of the read voltage $V_r$ causes current at level X to flow through the memory device 130 (current level X being determined by the (lower) resistance characteristic K of the memory device 130, so that current level X is greater than current level W). The current level X is indicative of the memory device being in its second state, and this current level can readily be observed.

With the memory device 130 in its third state (FIG. 6), application of the read voltage $V_r$ causes current at level Y to flow through the memory device 130 (current level Y determined by the (even lower) resistance characteristic L of the memory device 130, so that current level Y is greater than current level X and current level W). The current level Y is indicative of the memory device 130 being in its third state, and this current level Y can readily be observed.

With the memory device in its erased state (FIG. 7), application of the read voltage $V_r$ causes substantially no current (indicated at Z) to flow through the memory device 130, because of the very high resistance characteristic M (i.e., much higher resistance than in any of the previous examples) of the memory device 130. This lack of current flow is indicative of the memory device 130 being in its erased, or fourth state, which can readily be observed.

Figure 8:
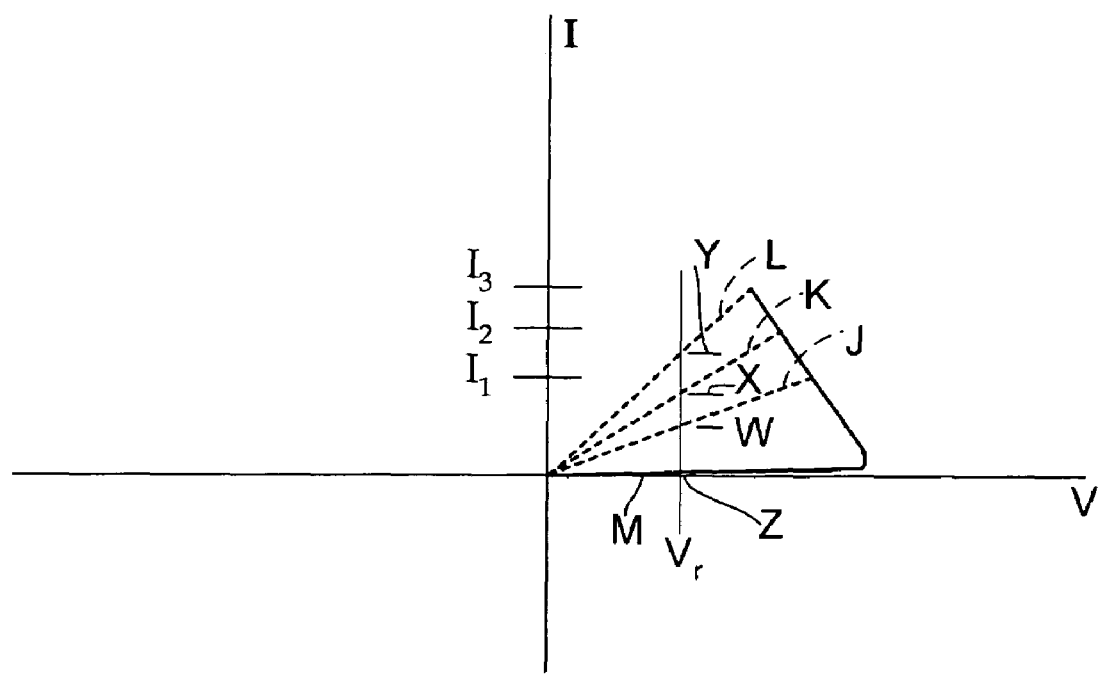
FIG. 8 is a plot of current vs. voltage illustrating together the various states of FIGS. 4, 5, 6 and 7.

FIG. 8 is a composite of FIGS. 4-7, illustrating the various states of the memory device 130 in one Figure. As will readily be seen, selection of one of a plurality of levels of current $I_1$, $I_2$, $I_3$ applied to the memory device 130 programs the memory device 130 and determines a corresponding resistance characteristic thereof. As noted above, each different level of current applied to the memory device 130 results in and determines a corresponding, different resistance characteristic of the memory device 130. The resistance characteristic determines the level of current flow through the memory device 130 during the read step.

In the present example, the memory device 130 is shown and described as adopting any one of four distinct, individual states. As described above, these four different states of the memory device 130 can provide two bits of information.

Figure 9:
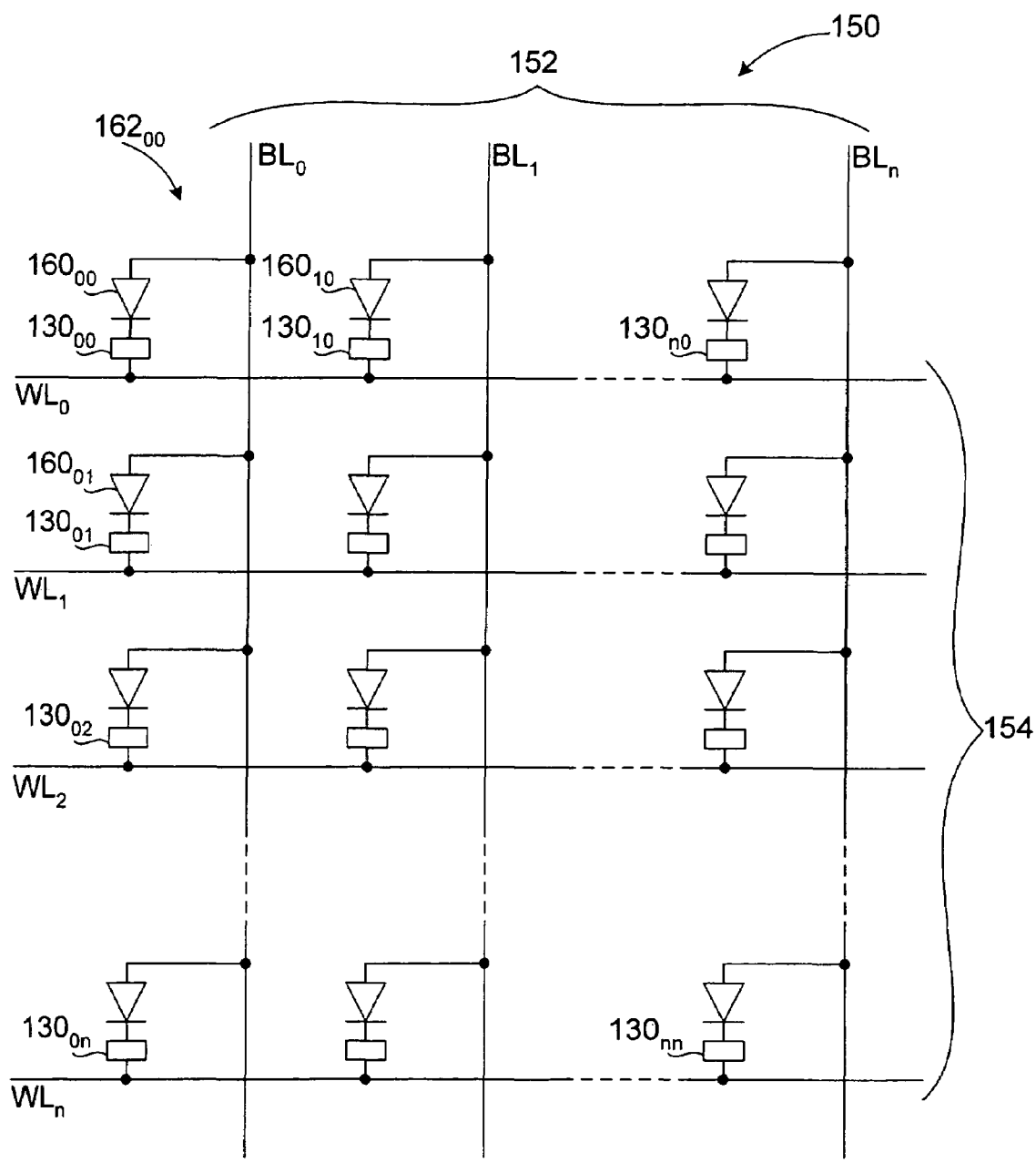
FIG. 9 is a schematic illustration of a first embodiment of memory array incorporating the present invention.

FIG. 9 illustrates a first embodiment of memory device array 150 which incorporates memory devices 130 of the type described above. As illustrated in FIG. 9, the memory device array 150 includes a first plurality 152 of parallel conductors (bit lines) $BL_0$, $BL_1$, . . . $BL_n$, and a second plurality 154 of parallel conductors (word lines) $WL_0$, $WL_1$, . . . $WL_n$ overlying and spaced from, orthogonal to, and crossing the first plurality of conductors 152. A plurality of memory devices 130 of the type described above are included, each associated with a select diode 160 having a (forward) threshold $V_t$ and a (reverse) breakdown voltage $V_b$, to form a memory device-diode structure 162 connecting a bit line and a word line. Each memory device 130 is connected in series with a select diode 160 between a conductor BL of the first plurality 152 thereof and a conductor WL of the second plurality 154 thereof at the intersection of those conductors, with the diode 160 oriented in a forward direction from the conductor BL of the first plurality 152 thereof to the conductor WL of the second plurality 154 thereof. For example, as shown in FIG. 9, memory device $130_{00}$ and diode $160_{00}$ in series connect conductor $BL_0$ of the first plurality of conductors 152 with conductor $WL_0$ of the second plurality of conductors 154 at the intersection of those conductors $BL_0$, $WL_0$, memory device $130_{10}$ and diode $160_{10}$ in series connect conductor $BL_1$ of the first plurality of conductors 152 with conductor $WL_0$ of the second plurality of conductors 154 at the intersection of those conductors $BL_1$, $WL_0$, etc. Programming of individual memory devices can be achieved by utilizing comparators as part of the external circuitry of the array 150 and associated with the memory devices. These comparators function to limit the level of programming current to the memory devices.

Figure 10:
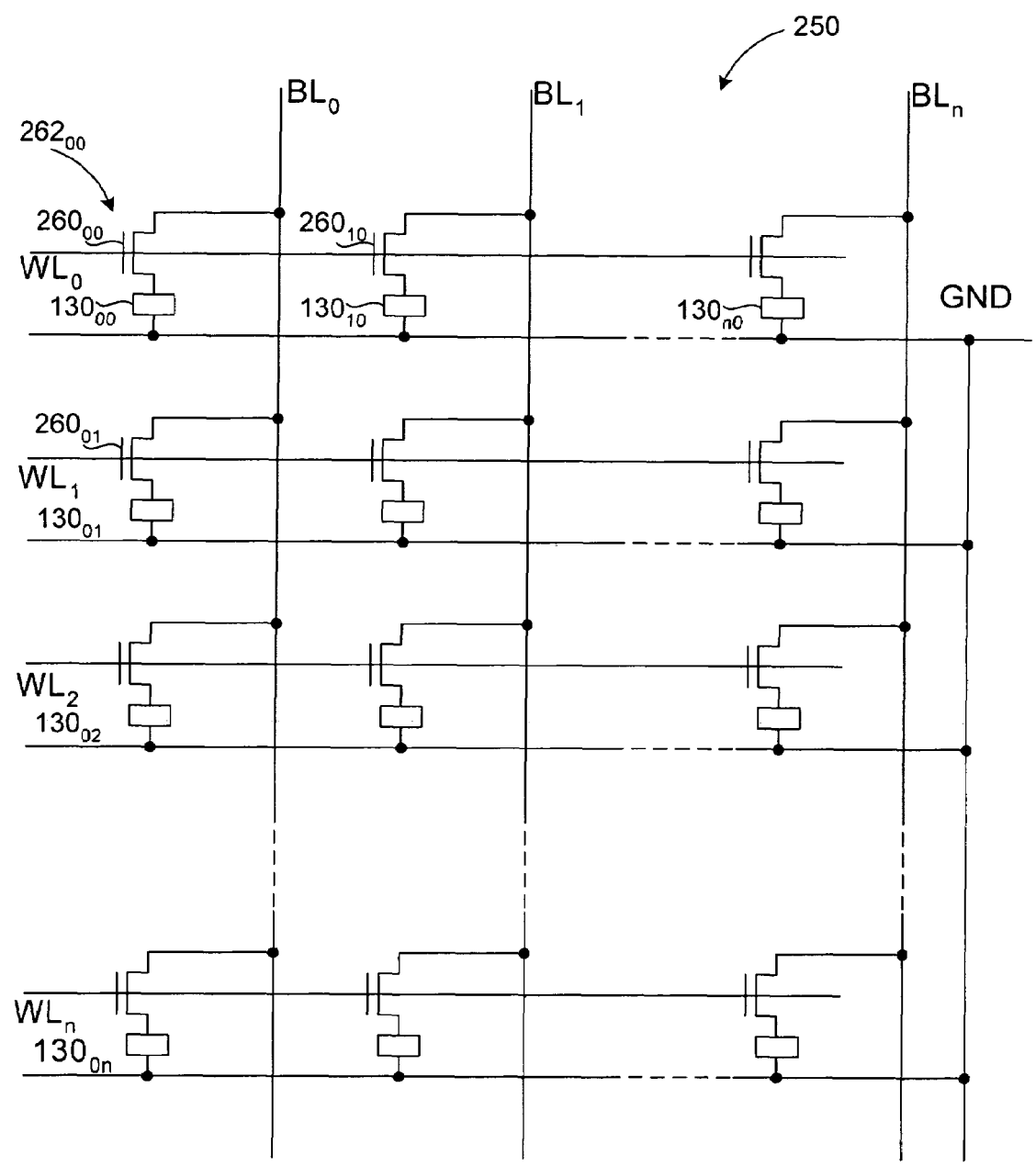
FIG. 10 is a schematic illustration of a second embodiment of memory array incorporating the present invention

FIG. 10 illustrates a second embodiment of memory device array 250 which incorporates memory devices 130 of the type described above. As illustrated in FIG. 10, the memory device array 250 includes a first plurality of parallel conductors (bit lines) $BL_0$, $BL_1$, . . . $BL_n$, and a second plurality of parallel conductors (word lines) $WL_0$, $WL_1$, . . . $WL_n$, overlying and spaced from, orthogonal to, and crossing the first plurality of conductors. A plurality of memory devices 130 of the type described above are included, each associated with a transistor 260 to form a memory device-transistor structure 262 connecting a bit line and ground (GND). Each memory device 130 is connected in series with a transistor 260 between a conductor BL of the plurality thereof and GND. Each word line is connected to the gates of a row of transistors. Programming of an individual memory device is achieved by utilizing the transistor associated with that device to limit the level of programming current to that device, the level of current being determined by the level of voltage applied to the gate of that transistor.

As examples, in each array, the memory device $130_{00}$ may be programmed to the first state, the memory device $130_{01}$ may be programmed to the second state, the memory device $130_{02}$ may be programmed to the third state, and the memory device $130_{0n}$ may be in the erased state. Thus, each memory device of the array in the present example is capable of providing two bits of information.

It will be understood that the difference in current level I when programming the memory device 130 can be set more closely than in the present example, i.e., $I_1$, $I_2$, $I_3$, so that the memory device 130 would be capable of adopting more than four individual states.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming a memory device which is capable of having any of a plurality of states comprising applying a selected level of current to the memory device to provide that the memory device has a first of the plurality of states, and applying a selected level of current to the memory device in the same direction as the first-mentioned selected level of current to provide that the memory device has a second of the plurality of states.

2. The method of claim 1 wherein the selected levels of current are different from each other.

3. The method of claim 1 wherein the selected levels of current provide different respective memory device characteristics.

4. A method of programming a memory device which is capable of having any of a plurality of states comprising applying a selected level of current to the memory device to provide that the memory device has one of the plurality of states, and further comprising applying a second selected level of current to the memory device different from the first-mentioned selected level of current, to provide that the memory device has a second of the plurality of states, and further comprising applying a third selected level of current to the memory device different from the first and second selected levels of current, to provide that the memory device has a third of the plurality of states.

5. The method of claim 4 wherein the application of the first selected level of current to the memory device provides a first memory device resistance characteristic, wherein the application of the second selected level of current to the memory device provides a second memory device resistance characteristic different from the first memory device resistance characteristic, and wherein the application of the third selected level of current to the memory device provides a third memory device resistance characteristic different from the first and second memory device resistance characteristics.

6. A method of undertaking a procedure on a memory device which is capable of having any of a plurality of states comprising:
   applying a first selected level of current to the memory device to provide a first resistance characteristic of the memory device;
   applying a read electrical potential to the memory device to read the state of the memory device;
   applying a second selected level of current to the memory device to provide a second resistance characteristic of the memory device different from the first resistance characteristic of the memory device;
   applying said read electrical potential to the memory device to read the state of the memory device;
   applying a third selected level of current to the memory device to provide a third resistance characteristic of the memory device different from the first and second resistance characteristics of the memory device; and
   applying said read electrical potential to the memory device to read the state of the memory device.

7. The method of claim 6 and further comprising a current source for applying the first, second and third selected levels of current to the memory device.

8. A method of programming a memory device comprising first and second electrodes, and an active layer between the first and second electrodes, the method comprising applying a selected level of current to the memory device to provide a memory device state, the memory device state being achieved independent of the magnetic state of the memory device.

9. The method of claim 8 and further comprising applying a second selected level of current different from the first-mentioned selected level of current to provide a second memory device state.

10. The method of claim 9 wherein application of the first-mentioned selected level of current to the memory device provides a first resistance characteristic of the memory device, and the application of the second selected level of current to the memory device provides a second resistance characteristic of the memory device different from the first resistance characteristic of the memory device.

11. The method of claim 10 and further comprising a current source for applying the first and second selected levels of current to the memory device.

12. A method of programming memory devices of a memory array comprising a first plurality of conductors, a second plurality of conductors, and a plurality of connecting structures, each connecting a conductor of the first plurality thereof with a conductor of the second plurality thereof, each connecting structure comprising a memory device, each memory device being capable of having any of a plurality of states, the method comprising:

applying a first selected level of current to a first memory device of the array to provide that the first memory device has a first of the plurality of states;

applying a second selected level of current to a second memory device of the array to provide that the second memory device has a second of the plurality of states; and further applying a third selected level of current to a third memory device of the array to provide that the third memory device has a third of the plurality of states.

13. The method of claim 12 and further comprising the step of applying a read electrical potential to the first memory device to read the state of the first memory device.

14. The method of claim 13 and further comprising applying the read electrical potential to the second memory device to read the state of the second memory device.

15. The method of claim 14 wherein application of the first selected level of current to the first memory device of the array provides a first resistance characteristic of the first memory device, and application of the second selected level of current to the second memory device of the array provides a second resistance characteristic of the second memory device different from the first resistance characteristic of the first memory device.

16. The method of claim 12 and further comprising applying a read electrical potential to the first memory device to read the state of the first memory device, applying the read electrical potential to the second memory device to read this state of the second memory device, and applying the read electrical potential to the third memory device to read the state of the third memory device.

17. The method of claim 16 wherein application of the first selected level of current to the first memory device of the array provides a first resistance characteristic of the first memory device, application of the second selected level of current to the second memory device of the array provides a second resistance characteristic of the second memory device different from the first resistance characteristic of the first memory device, and application of the third selected level of current to the third memory device provides a third resistance characteristic of the third memory device different from the first and second resistance characteristic.

* * * * *